United States Patent [19]
Ogawa et al.

[11] Patent Number: 5,950,495
[45] Date of Patent: *Sep. 14, 1999

[54] TWO-ARMED TRANSFER ROBOT

[75] Inventors: Hironori Ogawa, Osaka; Hirokazu Yoda, Ibaraki, both of Japan

[73] Assignee: Daihen Corporation, Osaka, Japan

[*] Notice: This patent is subject to a terminal disclaimer.

[21] Appl. No.: 09/036,816

[22] Filed: Mar. 9, 1998

[30] Foreign Application Priority Data

Jul. 16, 1997 [JP] Japan ................................. 9-208367

[51] Int. Cl.$^6$ ........................................... B25J 18/00
[52] U.S. Cl. ................................. 74/490.01; 414/744.5; 414/935; 414/941
[58] Field of Search ........................ 414/935, 937, 414/939, 941, 744.5; 901/15; 74/479.01

[56] References Cited

U.S. PATENT DOCUMENTS

| | | | |
|---|---|---|---|
| 5,083,896 | 1/1992 | Uehara et al. | 414/935 |
| 5,151,008 | 9/1992 | Ishida et al. | 74/479.01 |
| 5,333,986 | 8/1994 | Mizukami et al. | 414/935 |
| 5,421,695 | 6/1995 | Kimura | 414/935 |
| 5,439,547 | 8/1995 | Kumagai | 414/937 |
| 5,636,963 | 6/1997 | Haraguchi et al. | 414/935 |
| 5,647,724 | 7/1997 | Davis, Jr. et al. | 414/937 |
| 5,813,823 | 9/1998 | Hofmeister | 901/15 |

FOREIGN PATENT DOCUMENTS 7-142552  6/1995  Japan .
8-71965   3/1996  Japan .

*Primary Examiner*—John A. Jeffery
*Assistant Examiner*—William C Joyce
*Attorney, Agent, or Firm*—Merchant, Gould, Smith, Edell, Welter & Schmidt, P.A.

[57] ABSTRACT

A two-armed transfer robot includes a pair of double-pantograph mechanisms. These mechanisms are substantially symmetrical to each other with a vertical plane. Each double-pantograph mechanism includes a first pantograph assembly and a second pantograph assembly. The second pantograph assembly supports a handling member for carrying a workpiece to be processed. The second pantograph assembly is offset away from the vertical plane with respect to the first pantograph assembly. A rotation-transmitting mechanism is provided between the first and the second pantograph assemblies of each double-pantograph mechanism. Thus, the two pantograph assemblies of each double-pantograph mechanism are actuated in cooperation for linearly moving the handling member. The handling members of the respective double-pantograph mechanisms are vertically spaced from each other. The handling members are arranged not only to move linearly but to rotate simultaneously around a vertical axis.

5 Claims, 15 Drawing Sheets

TWO-ARMED TRANSFER ROBOT

BACKGROUND OF THE INVENTION

1. Field of the Invention

The present invention relates to a two-armed transfer robot useful for semi-conductor manufacturing equipment, liquid crystal display processing equipment and the like. More particularly, the present invention relates to a two-armed transfer robot for transferring workpieces between processing chambers under a vacuum

2. Description of the Related Art

In general, transfer robots are used for semi-conductor manufacturing equipment, liquid crystal display processing equipment and the like. The robot has at least one arm mechanism provided with a handling member. An object to be processed or workpiece such as a silicon wafer is placed on the handling member. The arm mechanism is capable of moving horizontally in a straight line as well as rotating in a horizontal plane. A plurality of processing chambers for performing various kinds of processing are arranged around a rotation axis of the robot. With the use of the transfer robot, the workpiece is suitably brought to and taken away from a selected one of the processing chambers.

For improving efficiency in the transferring operation, use has been made of the so-called two-armed transfer robot having two arm mechanisms. Each arm mechanism has a free end at which a handling member is mounted.

A conventional two-armed transfer robot is disclosed in Japanese Patent Application Laid-open No. 7(1995)-142552 for example.

Referring to FIGS. 14–17 of the accompanying drawings, the prior art robot includes a stationary base frame 80, an inner frame 81 and a first arm 82. The inner frame is rotatable about a vertical axis $O_1$. relative to the base frame 80, while the first arm is rotatable about a first axis $P_1$ extending in parallel to the axis $O_1$. The rotation of the inner frame 81 is actuated by a driving device fixed to the base frame, while the rotation of the first arm 82 is actuated by a driving device fixed to the inner frame 81.

Reference numeral 83 indicates a second arm which is rotatable relative to the first arm 82 about a second axis $Q_1$. extending in parallel to the first axis $P_1$, while reference numeral 84A indicates a handling member which is rotatable relative to the arm 83 about a third axis $R_1$ extending in parallel to the second axis $Q_1$. Reference numeral 85 indicates a first rotation-transmitting member which is fixed to the inner frame 81 coaxially with the first axis $P_1$, while reference numeral 86 indicates a second rotation-transmitting member which is fixed to the second arm 83 coaxially with the second axis $Q_1$.

Reference numeral 87 indicates a third rotation-transmitting member fixed to the first arm 82 coaxially with the second axis $Q_1$, while reference numeral 88 indicates a fourth rotation-transmitting member fixed to the handling member 84 coaxially with the third axis $R_1$.

A first connecting member 89 is provided between the first rotation-transmitting member 85 and the second rotation-transmitting member 86, while a second connecting member 90 is provided between the third rotation-transmitting member 87 and the fourth rotation-transmitting member 88. The distance S between the first and second axes is equal to the distance between the third and fourth axes. The radius ratio of the first rotation-transmitting member 85 to the second rotation-transmitting member 86 is 2 to 1. The radius ratio of the fourth rotation-transmitting member 88 to the third rotation-transmitting member 87 is also 2 to 1.

Chain sprockets or pulleys may be used for the first to fourth rotation-transmitting members 85–88. Correspondingly, the first and second connecting members 89, 90 may be chains or timing belts.

The first arm mechanism 91 is made up of the above-mentioned elements 82–90. A second arm mechanism 92, which is symmetrical to the first arm mechanism with respect to the X—X line, is supported for rotation about the second axis $P_2$ extending in parallel to the axis $O_1$.

Thus, the distance between the axis $O_1$. and the first axis $P_1$ is equal to that between the axis $O_1$ and the second axis $P_2$. The two-armed transfer robot is made up of the above elements 80–92.

The operations of the first and the second arm mechanisms 91, 92 are symmetrical with respect to the X—X line and substantially the same. Therefore, description will be made to the operation of the first arm mechanism 91.

First, it is assumed that the inner frame 81 is kept stationary to the fixed base frame 80, and that the first, second and third axes $P_1$, $Q_1$, $R_1$ are initially located on a common straight line, as shown in FIG. 16. Starting from this state, the first arm 82 is rotated counterclockwise through an angle θ about the first axis $P_1$.

During the above operation, the first rotation-transmitting member 85 is stationary, while the second axis $Q_1$ is rotated counterclockwise through the angle θ to be brought to the $Q_{11}$ position. As a result, a $Y_1$-side portion of the first connecting member 89 is wound around the first rotation-transmitting member 85, whereas a $Y_2$-side portion is unwound from the first rotation-transmitting member 85.

Thus, the first connecting member 89 is shifted in a direction shown by arrows $a_1$ and $a_2$. As a result, the second rotation-transmitting member 86 is rotated clockwise about the second axis $Q_1$.

As previously mentioned, the radius ratio of the first rotation-transmitting member 85 to the second rotation-transmitting member 86 is 2 to 1. Thus, when the first arm 82 is rotated counterclockwise about the first axis $P_1$ through the angle θ, the second rotation-transmitting member 86 is rotated clockwise about the second axis $Q_{11}$ through an angle 2θ.

At this time, since the second rotation-transmitting member 86 is fixed to the second arm 83, the second rotation-transmitting member 86 and the second arm 83 are rotated clockwise about the second axis $Q_1$ through an angle 2θ.

If the second arm 83 is not moved relative to the first arm 82, the third axis is brought to the $R_{11}$ position shown by broken lines when the first arm 82 is rotated counterclockwise about the first axis $P_1$ through an angle θ, starting from the initial state where the first, the second and the third axes $P_1$, $Q_1$, $R_1$ are positioned on the same line. Actually, however, the second rotation-transmitting member 86 is rotated clockwise about the second axis $Q_{11}$ through an angle 2θ. Therefore, the third axis $R_{11}$ is rotated clockwise about the second axis $Q_{11}$ through the angle 2θ, and brought to the $R_{12}$ position.

As a result, after the first arm 82 is rotated counterclockwise about the first axis $P_1$ through an angle θ, the third axis $R_{12}$ is still on the straight line extending through the first and the third axis $P_1$ and $R_1$.

Further, when the second arm 83 is rotated clockwise about the second axis $Q_{11}$ through an angle 2θ so that the third axis is brought to the $R_{12}$ position, a $Y_2$-side portion of the second connecting member 90 is wound around the third rotation-transmitting member 87, whereas a $Y_1$-side portion is unwound from the third rotation-transmitting member 87.

As a result, the second connecting member 90 is shifted in a direction $b_1$–$b_2$ shown in FIG. 16. Thus, the fourth rotation-transmitting member 88 is rotated counterclockwise about the third axis $R_{12}$.

When the second arm 83 is rotated clockwise about the second axis $Q_{11}$ through an angle 2θ as described above, the fourth rotation-transmitting member 88 is rotated counterclockwise about the third axis $R_{12}$ through an angle θ since the radius ratio of the fourth rotation-transmitting member 88 to the third rotation-transmitting member 87 is 2 to 1. As a result, a point $C_0$ of the fourth rotation-transmitting member 88 is brought to a point $C_1$ on the straight line passing through the first and the third axes $P_1$, $R_{12}$.

Upon rotation of the first arm 82 about the first axis $P_1$ in the counterclockwise direction as described above, the first arm mechanism 91 is actuated in the X-direction. Accordingly, the handling member 84A is moved along the line passing through the first and the third axes $P_1$, $R_1$. During this movement, however, the handling member 84A does not changed its attitude or orientation since it is fixed to the fourth rotation-transmitting member 88.

Likewise, the second arm mechanism 92 is actuated in the X-direction, while the second handling member 84B keeping its initial attitude along the line passing through the first and the third axes P2, $R_2$.

The first and the second handling members 84A, 84B are arranged between the axes $P_1$, $P_2$ as viewed in the $Y_1$–$Y_2$ direction.

Further, the extremities of the handling members 84A, 84B are vertically spaced from each other. Thus, upon actuation of the arm mechanisms 91, 92, the handling members 84A, 84B can move along the X—X line passing through the axis $O_1$ without interfering with each other.

When the inner frame 81 is rotated about the axis $O_1$, the first and the second arm mechanisms 91, 92 are simultaneously rotated about the axis $O_1$.

As shown in FIG. 17, a suitable number (six in the figure) of processing chambers are arranged around the axis $O_1$ of the two-armed transfer robot. Workpieces are transferred by the robot to these chambers to be processed.

The prior art transfer robot has been found to have the following disadvantages. First, the fourth rotation-transmitting member 88 and the second connecting member 90 are provided at the extremity of the second arm 83 for maintaining the initial orientation of the handling member 84 along the $P_1$–$R_1$ line. Therefore, the height $H_1$ (see FIG. 15) of the arm mechanism is made unfavorably large. This requires that each processing chamber have a large insertion window to allow the passage of the arm mechanism.

Further, as shown in FIGS. 14–16, the axis $P_1$ of the first arm mechanism 91 and the axis $P_2$ of the second arm mechanism 92 are spaced from each other, with the axis $O_1$ of the inner frame 81 located therebetween. This arrangement renders the rotation radius of the inner frame 81 unfavorably large.

Accordingly, the bearings 93 provided around the inner frame 81 have an unfavorably large diameter, and the magnetic fluid seal 94 for hermetic sealing suffers the same problem. With the use of such bearings and magnetic fluid seal, the overall size of the robot is also increased. Therefore, the price of the robot is rendered unduly high.

Further, the driving devices for linearly moving the handling members 84A, 84B are mounted on the inner frame 81. Thus, the driving devices are rotated together with the inner frame 81. For supplying the driving devices with electricity, use is made of a cable extending from the base frame 80. Thus, the rotation angle or the number of rotation of the inner frame 81 is limited for preventing the cable from breaking.

For realizing the above-mentioned prevention, a suitable monitoring device and a controlling unit are needed to stop the rotation of the inner frame 81 before the rotation angle of the frame exceeds a predetermined threshold value (540° for example). However, such additional devices make the robot expensive. More importantly, the additional devices do not eliminate the limitation to the rotation angle. Thus, the conventional robot is not only expensive but inconvenient to operate.

SUMMARY OF THE INVENTION

It is, therefore, an object of the present invention to provide a compact, inexpensive two-armed transfer robot which is easy to operate and capable of providing good productivity.

According to a first aspect of the present invention, there is provided a two-armed transfer robot including: a first double-pantograph mechanism and a second double-pantograph mechanism symmetrical to the first double-pantograph mechanism with respect to a vertical plane. Each double-pantograph mechanism includes a first pantograph assembly and a second pantograph assembly. The first pantograph assembly has an inner link, a pair of first intermediate links and an outer link associated with the inner link via the first intermediate links. The second pantograph assembly includes the outer link in common with the first pantograph assembly, a pair of second intermediate links and a hand-supporting link associated with the outer link via the second intermediate links. The inner link is common to the first and the second double-pantograph mechanisms. The robot further includes: rotation-transmitting mechanisms provided between the first and the second intermediate links of the respective double-pantograph mechanism; first and second handling members supported by the hand-supporting links of the first and the second double-pantograph mechanisms, respectively; a stationary base member; first to third shafts coaxially rotatable about a first axis extending vertically; and first to third driving devices for actuating the first to the third shafts, respectively. The driving devices are fixed to the base member.

One of the first intermediate links of the first double-pantograph mechanism is fixed to the first shaft for rotation about the first axis, while one of the first intermediate links of the second double-pantograph mechanism is fixed to the second shaft for rotation about the first axis. The inner link is fixed to the third shaft for rotation about the first axis. The other first intermediate links of the respective double-pantograph mechanisms are supported by the inner link for rotation about a common second axis. The first intermediate links and second intermediate links of each double-pantograph mechanism are equal in length. The second pantograph assembly of each double-pantograph mechanism is offset away from the first axis with respect to the first pantograph assembly of said each double-pantograph mechanism. The first and the second handling members are vertically spaced from each other. The handling members are arranged not only to linearly move in horizontal lines passing through the first axis but to rotate simultaneously around the first axis.

With such an arrangement, the first to the third shafts are coaxially supported about a common vertical axis. Thus, the bearings and the seals provided around the respective shafts are made small in diameter. As a result, the overall size of the transfer robot is rendered relatively small as compared with the conventional robot. Accordingly, the price of the robot is reduced.

Further, according to the present invention, the pantograph assembly carrying a handling member is made advantageously small in thickness since there is no need to use the conventional rotation-transmitting member and connecting member described above Thus, the height $H_2$ of the base portions of the respective handling members is reduced. Accordingly, the size of the insertion window of each processing chamber is also reduced.

Further, the first to the third driving devices are attached to the stationary base member. Therefore, unlike the conventional robot, there is no limitation to the rotational angle of the first and the second handling members around the first axis. Thus, the present invention serves to increase productivity.

The second intermediate links of the respective double-pantograph mechanisms may be arranged in a common plane.

The hand-supporting link of one double-pantograph mechanism may be attached to an upper surface of each second intermediate link of said one double-pantograph mechanism, while the hand-supporting link of the other double-pantograph mechanism may be attached to a lower surface of each second intermediate link of said other double-pantograph mechanism.

The first double-pantograph mechanism may include a third handling member which is attached to the hand-supporting link of the first double-pantograph mechanism in a manner that the third handling member projects opposite to the first handling member. Similarly, the second double-pantograph mechanism may include a fourth handling member which is attached to the hand-supporting link of the second double-pantograph mechanism in a manner that the fourth handling member projects opposite to the second handling member.

Each of the first to the third shafts may be rotatably supported via a magnetic fluid seal for hermetic sealing.

Other objects, features and advantages of the present invention will be fully understood from the following detailed description given with reference to the accompanying drawings.

BRIEF DESCRIPTION OF THE DRAWINGS

In the accompanying drawings

DETAILED DESCRIPTION OF THE PREFERRED EMBODIMENTS

The present invention will now be described in more specific detail on the basis of embodiments shown in the accompanying drawings.

Referring to FIGS. 1–9, there is illustrated a two-armed transfer robot according to a first embodiment of the present invention. The transfer robot includes a stationary base member 1 and first to third shafts 2–4. The shafts 2–4 are supported by the base member 1 via suitable bearings. The shafts 2–4 are coaxially rotatable about a first axis $O_1$ extending vertically. The base member 1 may be installed in a vacuum chamber V.C. For maintaining the vacuum condition in the vacuum chamber, magnetic fluid seals 5–7 are provided around the respective shafts 2–4.

The illustrated robot also includes first to third driving devices 8–10 for actuation of the respective shafts 2–4. Each driving device is associated with corresponding one of the shafts via a suitable speed reducer, a rotation-transmitting member such as a sprocket or a pulley for example, and a connecting member such as a chain or a timing belt for example.

Figure 8:
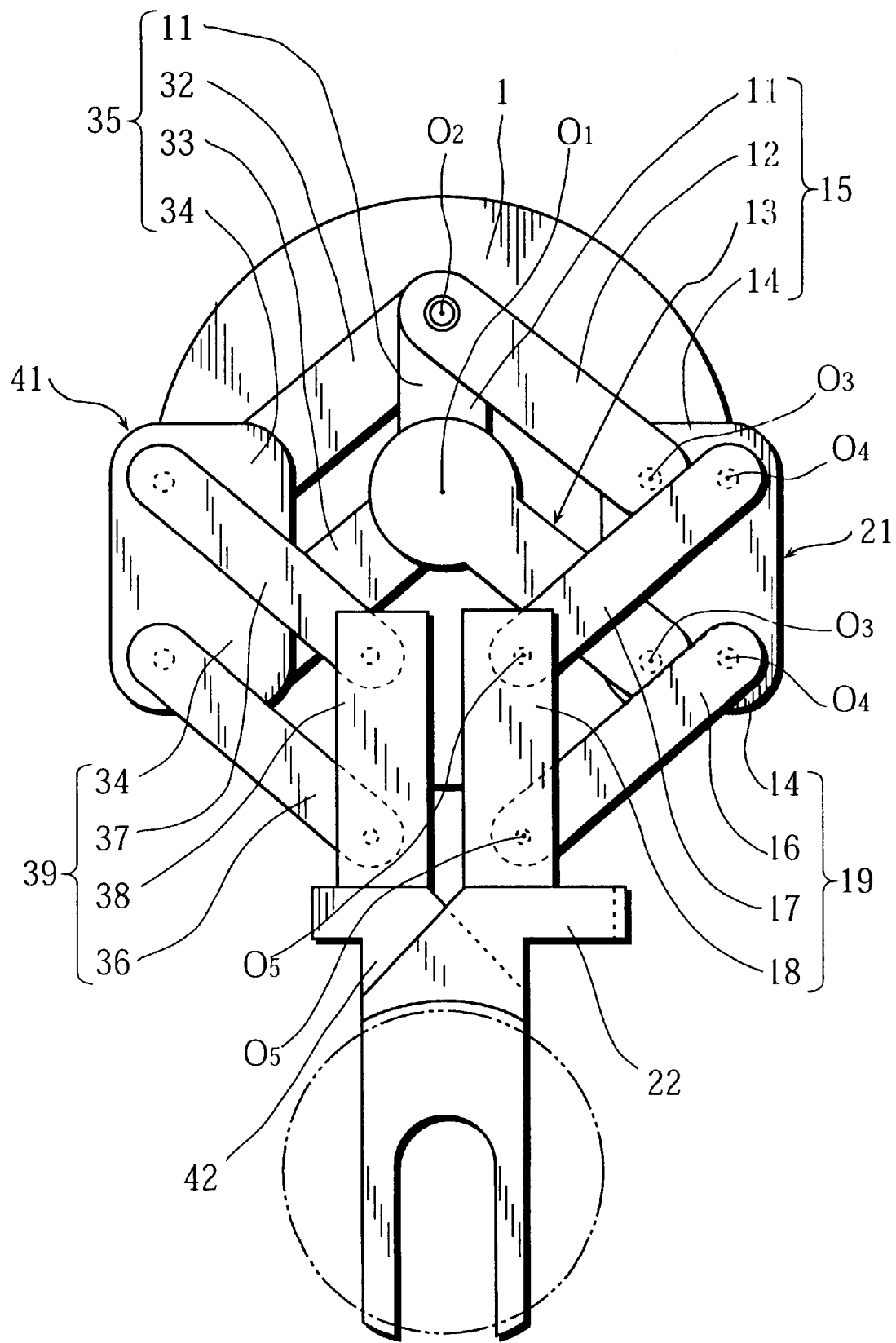
FIG. 8 is a plan view showing the two double-pantograph mechanisms of the robot in operation.

As shown in FIG. 8, the robot further includes a first pantograph assembly 15 made up of an inner link 11, a pair of first intermediate links 12, 13 and an outer link 14. The inner link 11 extends from the upper end of the third shaft 4 driven by the third driving device 10. An end of the first intermediate link 12 is connected to the inner link 11 for pivotal movement about a second axis $O_2$, while the opposite end of the first intermediate link 12 is connected to the outer link 14 for pivotal movement about a third axis $O_3$ (see also FIGS. 5–6). An end of the first intermediate link 13 is fixed to the first shaft 2 driven by the first driving device 8 (see also FIG. 4), while the opposite end of the first intermediate link 13 is connected to the outer link 14 for pivotal movement about another third axis $O_3$. Thus, upon actuation of the first driving device 8, the first intermediate link 13 is caused to pivot about the first axis $O_1$.

Similarly, a second pantograph assembly 19 is made up of the outer link 14, a pair of second intermediate links 16, 17 and a hand-supporting link 18. Each of the second intermediate links 16, 17 has an end connected to the outer link 14 for pivotal movement about a fourth axis $O_4$, and the opposite end connected to the hand-supporting link 18 for pivotal movement about a fifth axis $O_5$. The second pantograph assembly 19 is offset in the $X_2$-direction with respect to the first pantograph assembly 15. Thus, the line connecting the two fourth axes $O_4$ is spaced from the line connecting the two third axes $O_3$ in the $X_2$-direction.

In the illustrated embodiment, the distance between the first axis $O_1$ and the third axis $O_3$ of the first intermediate link 13 is equal to the distance between the second axis $O_2$ and the third axis $O_3$ of the first intermediate link 12. The former distance is also equal to the distance between the fourth axis $O_4$ and the fifth axis $O_5$ of each second intermediate link.

Figure 4:
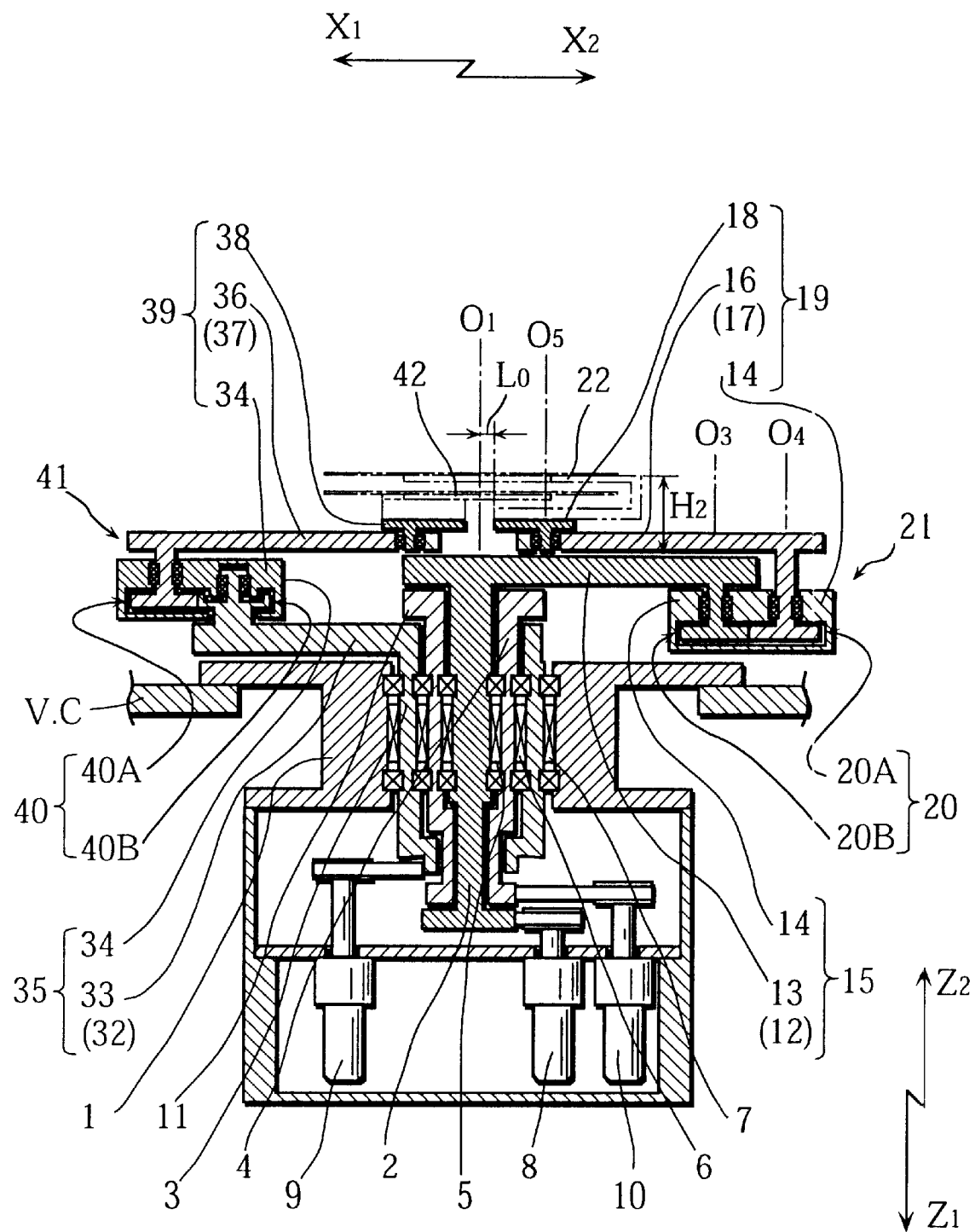
FIG. 4 is a sectional view taken along lines IV—IV in FIG. 2.
Figure 5:
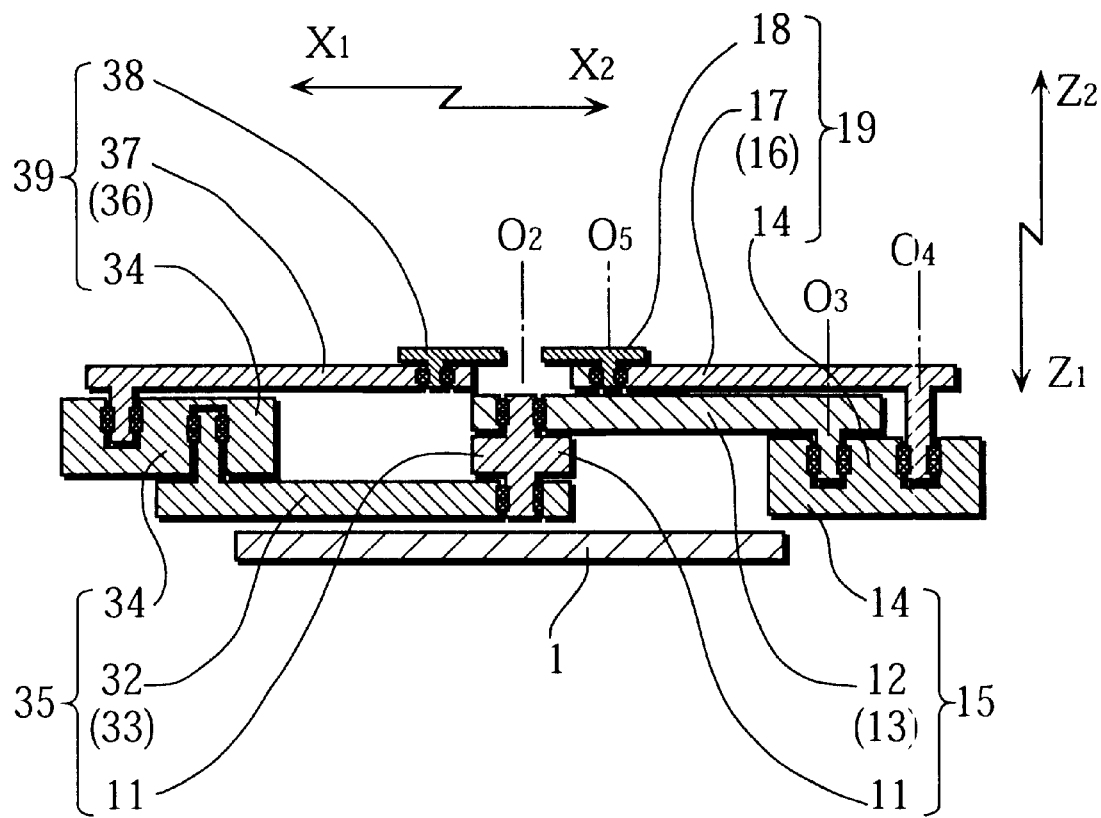
FIG. 5 is a sectional view taken along lines V—V in FIG. 2.
Figure 6:
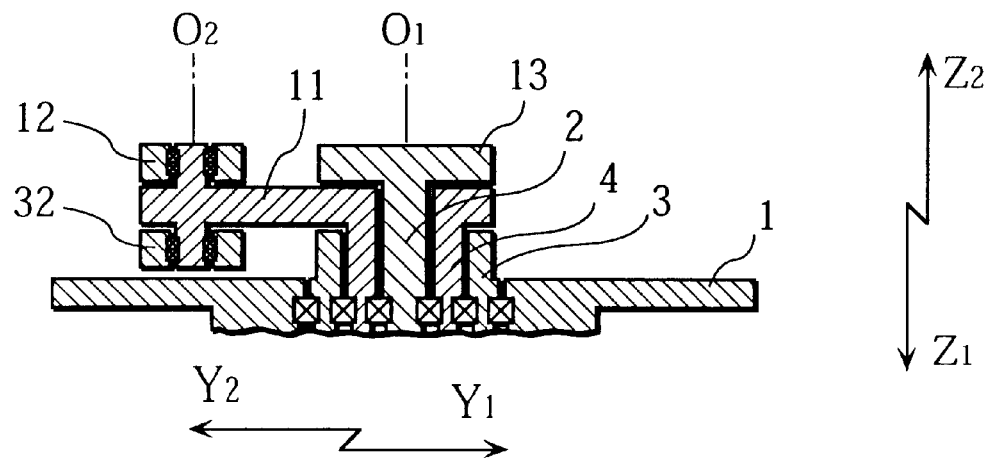
FIG. 6 is a sectional view taken along lines VI—VI in FIG. 2.
Figure 7:
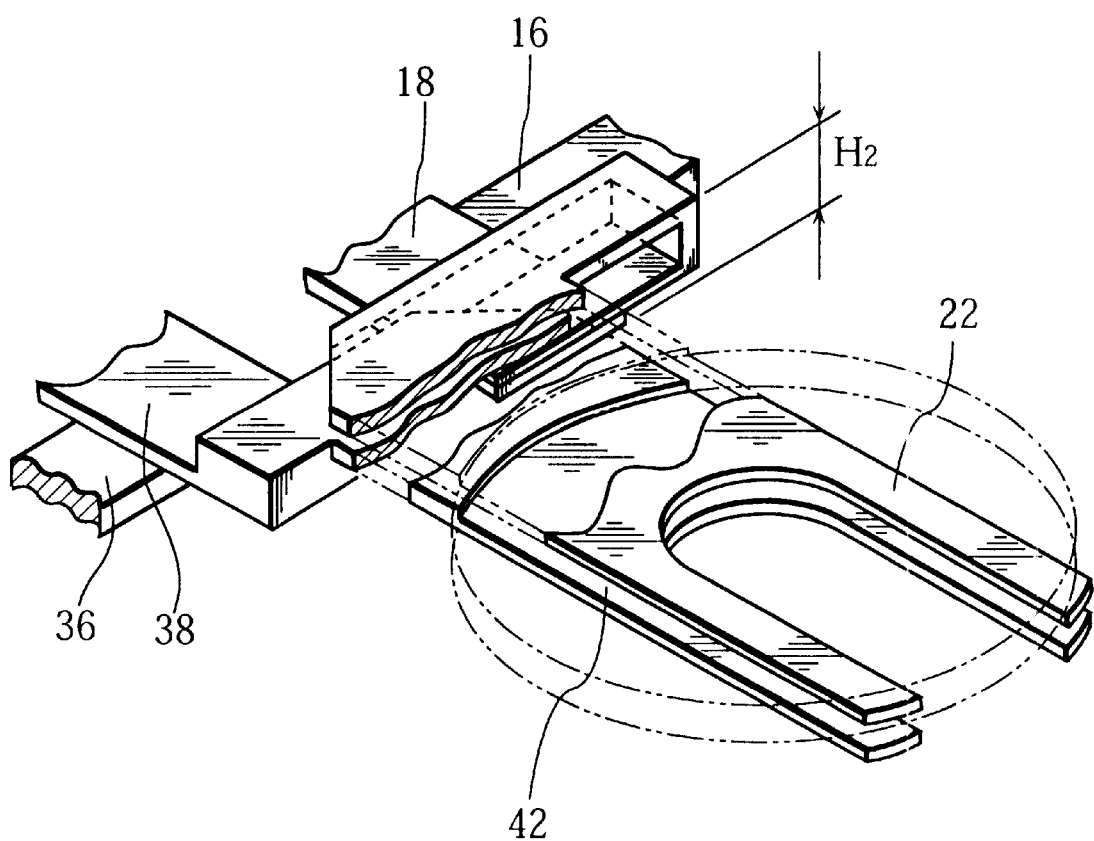
FIG. 7 is an enlarged view showing the handling members of the robot of FIG. 1.

A rotation-transmitting mechanism 20 is provided between the first intermediate link 13 and the second intermediate link 16 (FIG. 4). The rotation-transmitting mechanism 20 includes a first gear 20A fixed to the second intermediate link 16, and a second gear 20B fixed to the first intermediate link 13. The first and the second gears are arranged in mesh with each other.

The first shaft 2, the first driving device 8, the inner link 11 and the above-mentioned elements 12–20 are associated to form a first double-pantograph mechanism 21.

The robot also includes a second double-pantograph mechanism 41 having an arrangement which is substantially identical to that of the first double-pantograph mechanism 21. The second double-pantograph mechanism 41 is positionally symmetrical to the first double-pantograph mechanism 21 with respect to the first axis $O_1$.

Specifically, a first pantograph assembly 35 is provided which is made up of the inner link 11, a pair of first intermediate links 32, 33 and a second (outer) link 34. An end of the first intermediate link 32 is connected to the inner link 11 for pivotal movement about the second axis $O_2$, while the opposite end of the first intermediate link 32 is pivotably connected to the outer link 34 (see FIGS. 5–6). An end of the first intermediate link 33 is fixed to the second shaft 3 driven by the second driving device 9 (see FIG. 4), while the opposite end of the first intermediate link 33 is pivotably connected to the outer link 34. Thus, upon actuation of the second driving device 9, the first intermediate link 33 is caused to pivot about the first axis $O_1$.

Similarly, a second pantograph assembly 39 is made up of the outer link 34, a pair of second intermediate links 36, 37 and a hand-supporting link 38. Each of the second intermediate links 36, 37 has an end which is pivotably connected to the outer link 34, and the opposite end which is pivotably connected to the hand-supporting link 18. The second pantograph assembly 39 is offset in the $X_1$-direction with respect to the first pantograph assembly 35.

A similar rotation-transmitting mechanism 40 is provided between the first intermediate link 33 and the second intermediate link 36. The rotation-transmitting mechanism 40 includes a first gear 40A fixed to the second intermediate link 36, and a second gear 40B fixed to the first intermediate link 33. The first and the second gears are arranged in mesh with each other.

Figure 2:
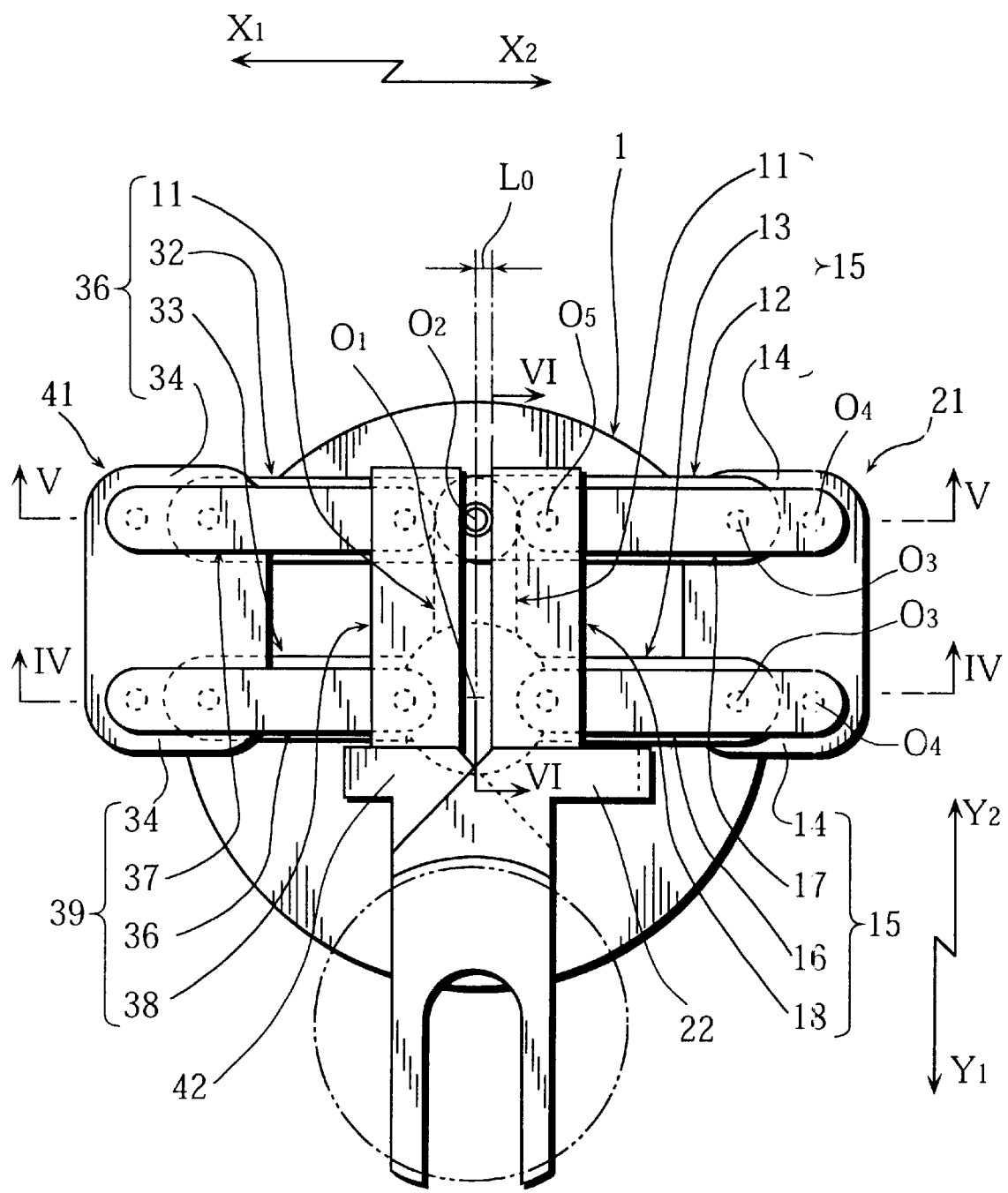
FIG. 2 is a plan view showing the robot of FIG. 1.
Figure 3:
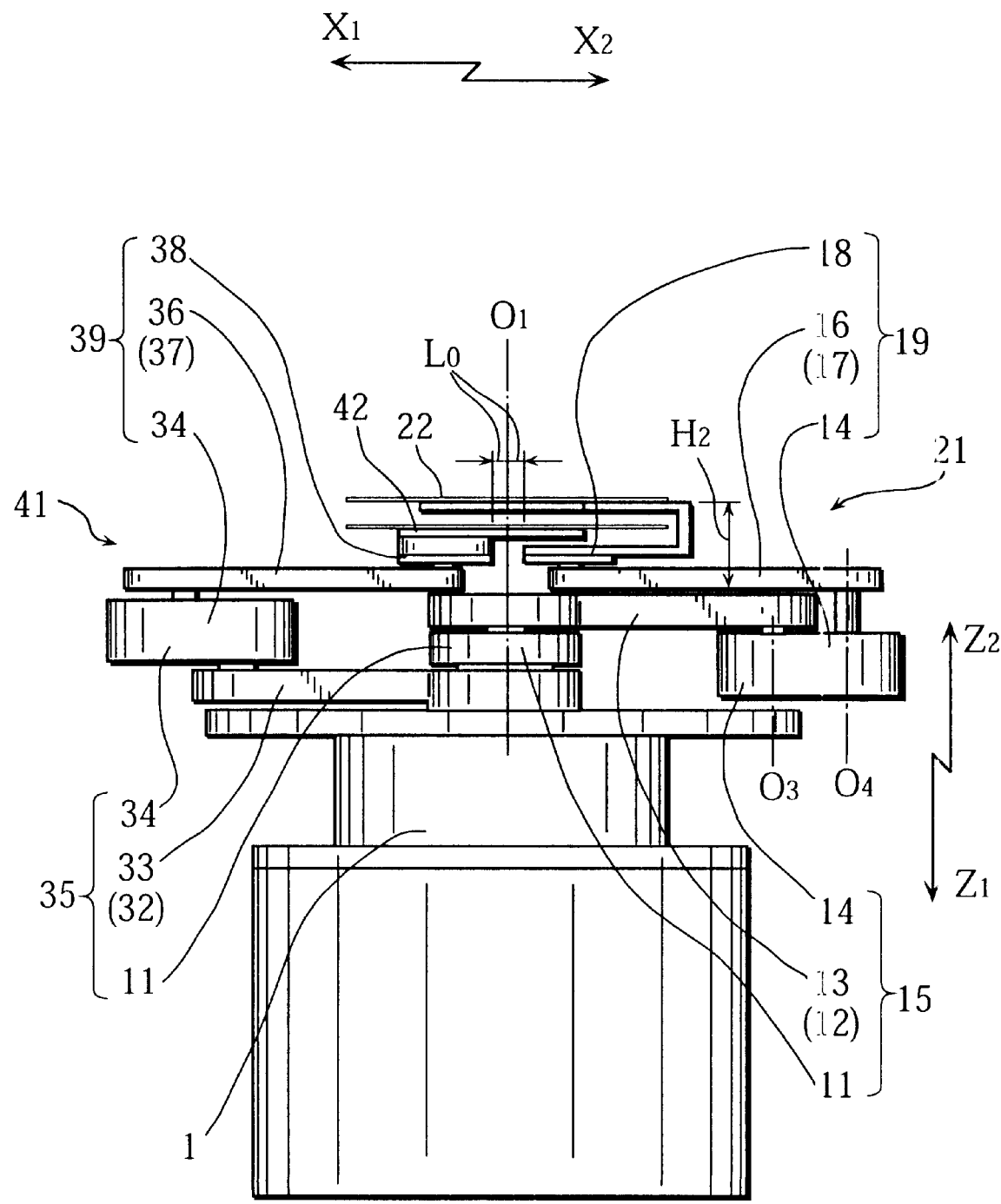
FIG. 3 is a front view showing the robot of FIG. 1.

The second shaft 3, the second driving device 9, the inner link 11 and the elements 32–40 are associated to form a second double-pantograph mechanism 41. As shown in FIG. 2, the first and the second double-pantograph mechanisms 21, 41 are symmetrically arranged in the $X_1-X_2$ direction with respect to the line connecting the first and the second axes $O_1$, $O_2$.

The hand-supporting link 18 of the first double-pantograph mechanism 21 carries a first handling member 22, while the hand-supporting link 38 of the second double-pantograph mechanism 41 carries a second handling member 42. The first and the second handling members 22, 42 are vertically spaced from each other. As will be described hereinafter, each handling member is actuated not only to linearly move along the horizontal line connecting the first and the second axes $O_1$, $O_2$, but to simultaneously rotate around the first axis $O_1$.

The illustrated transfer robot is made up of the elements 1–42 described above. A suitable number of processing chambers are arranged around the first axis $O_1$ in a known manner.

Description will be now made to the operation of the first double-pantograph mechanism 21. It is assumed that the straight line passing through the first and the second axes $O_1$, $O_2$ initially extends in the Y-direction, as shown in FIG. 2.

Upon actuation of the first driving device 8, the first shaft 2 and the first intermediate link 13 are rotated, clockwise for example as viewed from above, about the first axis $O_1$ through an angle θ. Then, the first pantograph assembly 15 is shifted in the $Y_1$-direction with the first and the second axes $O_1$, $O_2$ fixed at the original positions.

In the above instance, the first intermediate link 13 is rotated clockwise about the third axis $O_3$ through an angle θ with respect to the outer link 14. Consequently, the second intermediate link 16 is rotated, via the rotation-transmitting mechanism 20, counterclockwise about the third axis $O_4$ through an angle θ with respect to the second sink 14. Thus, the second pantograph assembly 19 is shifted in the $Y_1$-direction with respect to the fourth axes $O_4$.

As previously described, the distance between the first axis $O_1$ and the third axis $O_3$ of the first intermediate link 13 is equal to the distance between the fourth axis $O_4$ and the fifth axis $O_5$ of each second intermediate link. Thus, when the distance between the first axis $O_1$ and the third axis $O_3$ of the first intermediate link 13 is referred to as $L_1$ (see FIG. 9A), and the distance between the fourth and the fifth axes $O_3$, $O_4$ is referred to as $L_2$, the distance $X_{11}$ between the first and the fifth axes $O_1$, $O_5$ is equal to the distance $L_2$.

Figure 9A:
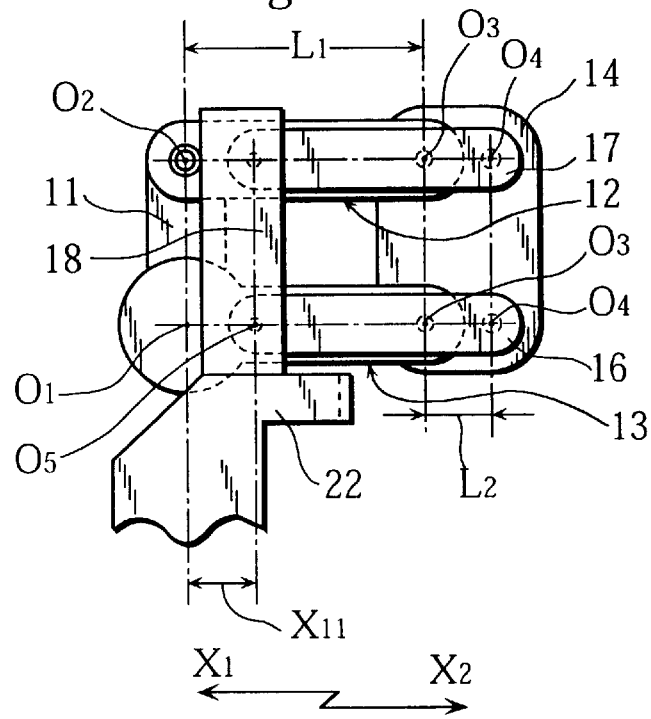
FIGS. 9A–9B are plan views illustrating the operation of the double-pantograph mechanism.
Figure 9B:
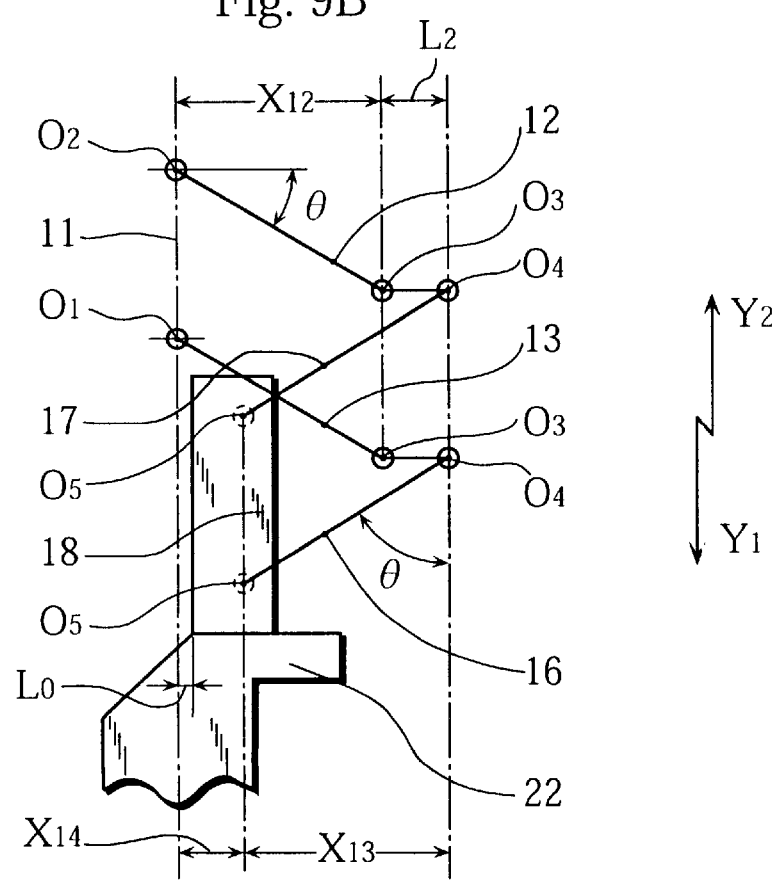

Referring to FIG. 9B where the first intermediate link 13 has been rotated clockwise about the first axis $O_1$ through an angle θ, distances $X_{12}$, $X_{13}$ and $X_{14}$ are defined between the axes as illustrated. Here, $X_{12}+L_2 = X_{13}+X_{14}$ holds. Further, the following relations hold.

$x_{12}=L_1 \cos θ$, and $x_{13}=L_1 \cos θ$.

From these, a relation that $X_{14}=L_2$ is obtained.

Therefore, it is known that $X_{11}=X_{14}=L_2$. Thus, upon clockwise or counterclockwise rotation of the first intermediate link 13 about the first axis $O_1$, the fifth axes $O_5$ are always held on the same line (which means that the hand-supporting link 18 maintains its initial attitude) as the hand-supporting link 18 is being moved in the Y-direction. Therefore, the distance $L_0$ between the hand-supporting link 18 and the line connecting the first axis $O_1$ and the second axis $O_2$ is kept constant while the first double-pantograph mechanism 21 is actuated.

The handling members 22, 42 are arranged so that the center lines of the respective members coincide, as viewed from above, with the line connecting the first axis $O_1$ and the second axis $O_2$. However, as previously described, the handling members 22, 42 are vertically spaced from each other. Thus, when moved horizontally, the handling members do not interfere with each other.

In transferring operation, the first handling member 22 is linearly moved in the $Y_1$-direction to a predetermined position (see FIG. 1B) upon actuation of the first double-pantograph mechanism 21. At the illustrated position, a workpiece is shifted onto or away from the handling member 22.

Figure 1A:
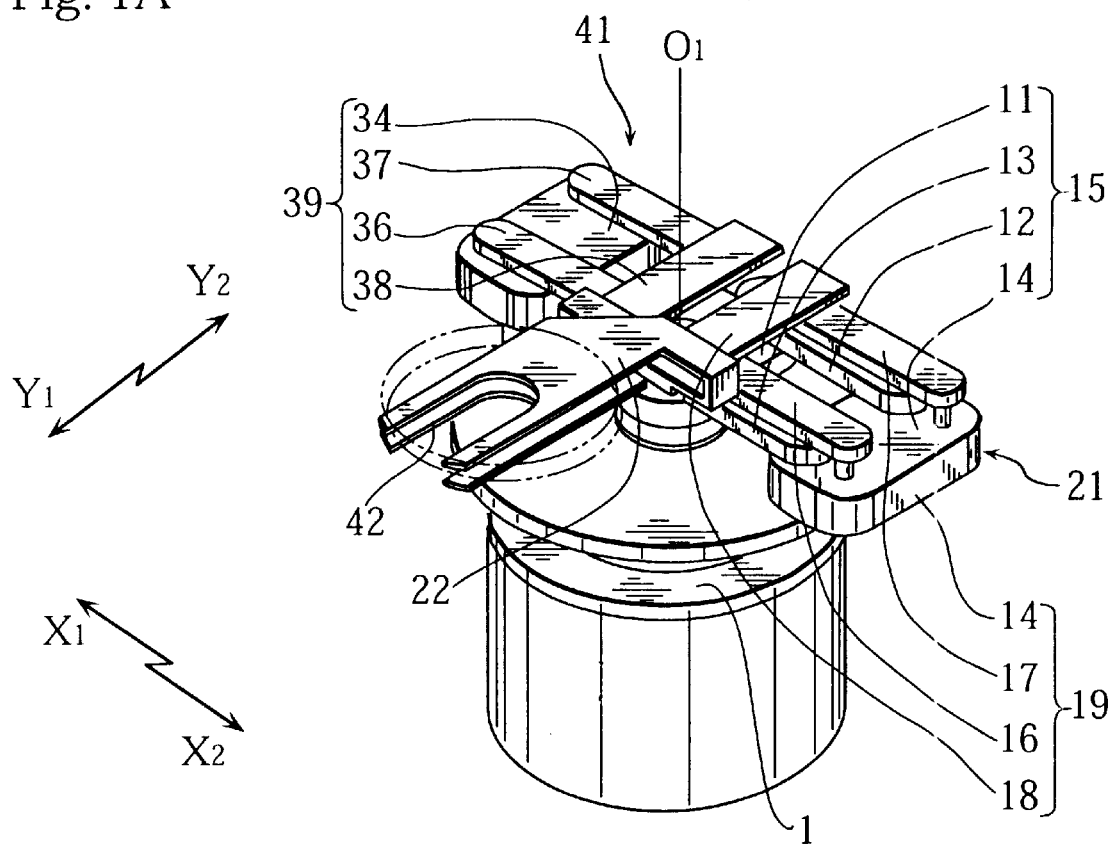
FIGS. 1A–1B are perspective views illustrating the operation of a double-pantograph mechanism of a two-armed transfer robot according to the present invention.
Figure 1B:
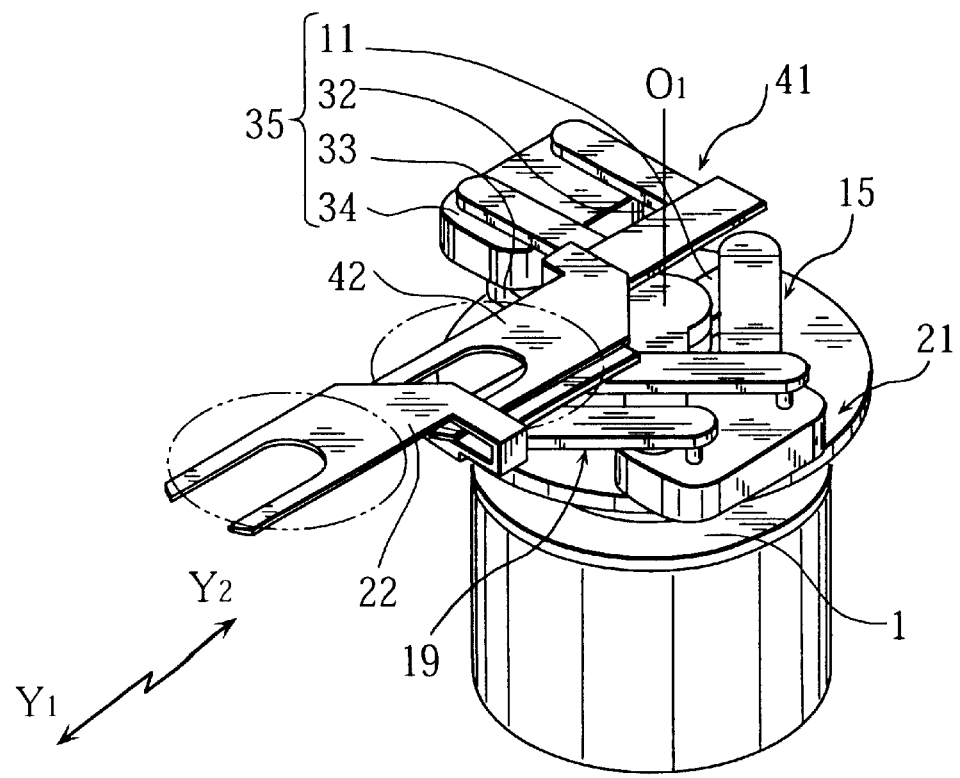

After the workpiece is shifted, the first double-pantograph mechanism 21 is moved inward to bring the first handling member 22 to the position illustrated in FIG. 1A. The position of FIG. 1A will be hereinafter referred to as "position of horizontal rotation".

When the first handling member 22 is at the position of horizontal rotation, the second double-pantograph mechanism 41 will be operated. As is easily understood, the operation of the second double-pantograph mechanism 41 is basically the same as that of the first double-pantograph mechanism 21.

The second handling member 42 is moved in the $Y_1$-direction when only the second driving device 3 is actuated. At this time, the second double-pantograph mechanism 41 is horizontally shifted outward to a predetermined position. In this position, a workpiece is shifted onto or away from the second handling member 42. Thereafter, the second double-pantograph mechanism 41 is moved inward toward the first axis $O_1$ to bring the second handling member 42 to the position of horizontal rotation.

The first and the second handling members 22, 42 are simultaneously rotated around the first axis $O_1$ in the following manner. specifically, with both handling members held at the position of horizontal rotation, the first to the third driving devices 8–10 are synchronously actuated for rotating the first to the third shafts 2–4 in the same direction and at the same angular speed. As a result, the elements attached to the first to the third shafts 2–4 are moved in the same direction. Thus, the above-mentioned elements as a whole are rotated clockwise or counterclockwise about the first axis $O_1$, with the handling members 22, 42 held in the position of horizontal rotation.

After the first and the second handling members 22, 42 are simultaneously rotated through a predetermined angle, one of the first and the second handling members 22, 42 is selectively moved outward in a horizontally-extending line passing through the first axis $O_1$. Then, workpieces are shifted onto or away from the handling members 24, 44.

As previously described, the distance between the first axis $O_1$ and the third axis $O_3$ of the first intermediate links 13, 33 is equal to the distance between the second axis $O_2$ and the third axis $O_3$ of the other first intermediate links 12, 32. The former distance is also equal to the distance between the fourth axis $O_4$ and the fifth axis $O_5$ of the second intermediate links 16–17 and 36–37. Further, the second pantograph assemblies 19, 39 are outwardly offset with respect to the first pantograph assemblies 15, 35, respectively. With such an arrangement, upon actuation of the first and the second double-pantograph mechanisms 21, 41, it is possible to linearly move hand-supporting links 18, 38 in parallel to the line connecting the first and the second axes $O_1$, $O_2$, while maintaining the horizontal distance between the hand-supporting links 18 and 38.

Further, it is possible to provide a simplified transmission assembly for transmitting power from the driving devices to the double-pantograph mechanisms. Thus, the height $H_2$ (see FIGS. 3, 4 and 7) is advantageously small. Accordingly, each processing chamber can be provided with a small window for insertion of the handling members.

Further, the first to the third shafts 2–4 are coaxially arranged for rotation about a common vertical axis. Thus, the bearings supporting the first to the third shafts 2–4 and the magnetic fluid seals 5–7 can be made small in diameter. Therefore, the transfer robot as a whole is advantageously compact and inexpensive. Since the shafts for actuating the first and the second arm mechanisms are coaxially supported about the first axis $O_1$, the distance between the transfer robot and each processing chamber is equal.

Further, unlike the prior art robot, the driving devices 8–10 of the present invention are fixed to the stationary base member 1, and thus the power cable for supplying the driving devices with electricity does not break due to the rotation of the handling members 22, 42. Such an arrangement makes it possible for the first and the second handling members 22, 42 to be rotated around the first axis $O_1$ through any desired angle. Thus, the robot of the present invention is more conveniently used than the prior art robot, so that productivity is improved. Further, the robot of the present invention is inexpensive since no additional devices for monitoring the rotation angle of the handling members are needed.

Further, it is possible to reduce the height $H_2$ for the base portions of the handling members 22, 42 by arranging the second intermediate links of the respective second pantograph assemblies in the same plane.

Figure 10:
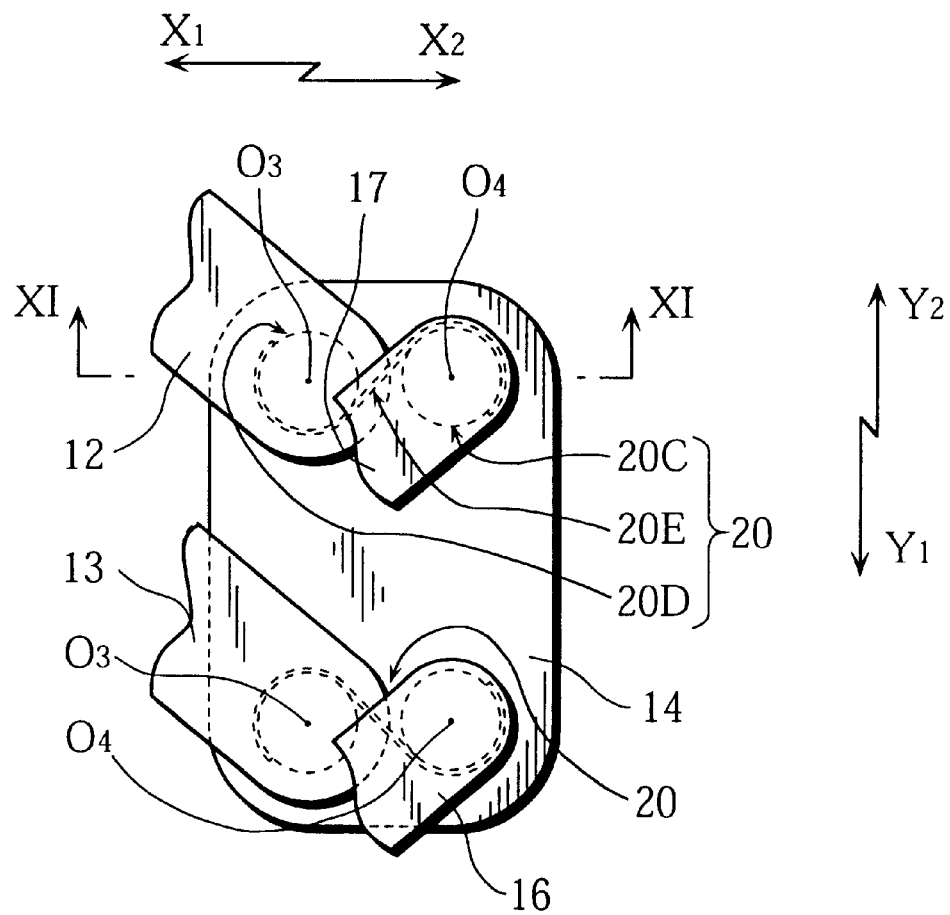
FIG. 10 is a plan view showing modified rotation-transmitting mechanisms.
Figure 11:
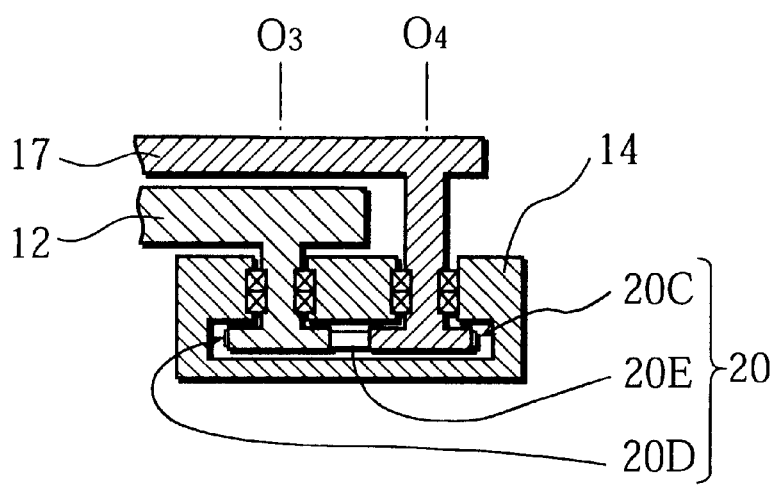
FIG. 11 is a sectional view taken along lines XI—XI in FIG. 10.

Referring to FIGS. 10 and 11, a modified rotation-transmitting mechanism 20 provided between the first and the second intermediate links 12, 17 includes a pulley 20D attached to the first intermediate link 12, a pulley 20C attached to the second intermediate link 17 and a belt 20E extending between the above pulleys. The pulley 20D is concentric with the third axis $O_3$, while the pulley 20C is concentric with the fourth axis $O_4$. A similar rotation-transmitting mechanism may additionally be provided between the first intermediate link 13 and the second intermediate link 16.

Figure 12:
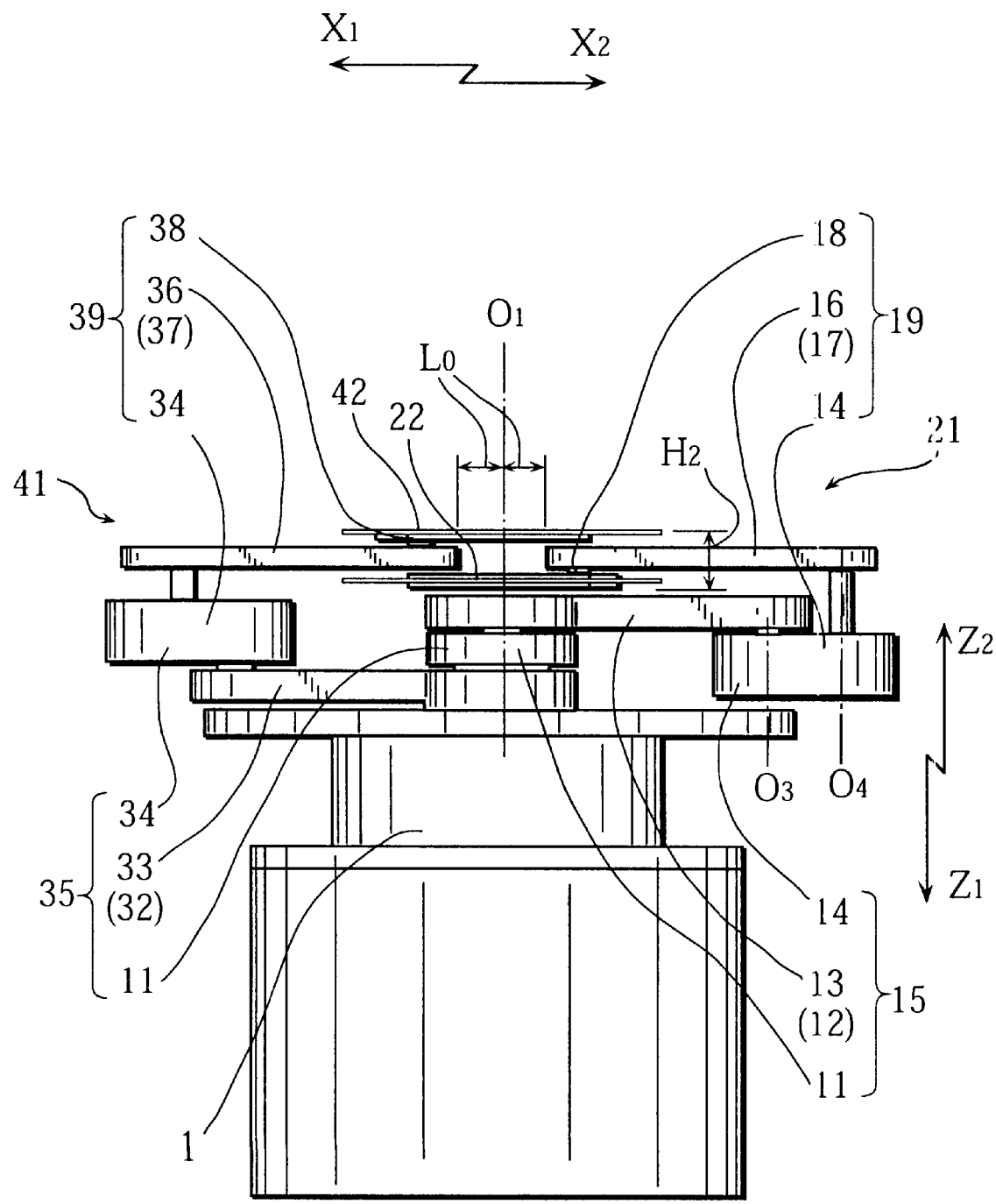
FIG. 12 is a front view showing a modified arrangement for the handling members.

FIG. 12 illustrates a modified pair of second pantograph assemblies. In these assemblies, the hand-supporting link 38 of the double-pantograph mechanism 41 is attached to the upper surfaces of the respective second intermediate links 36, 37, while the other hand-supporting link 18 is attached to the lower surfaces of the respective second intermediate links 16, 17. With such an arrangement, the height $H_2$ of the base portions of the handling members 22, 42 is minimized.

Figure 13A:
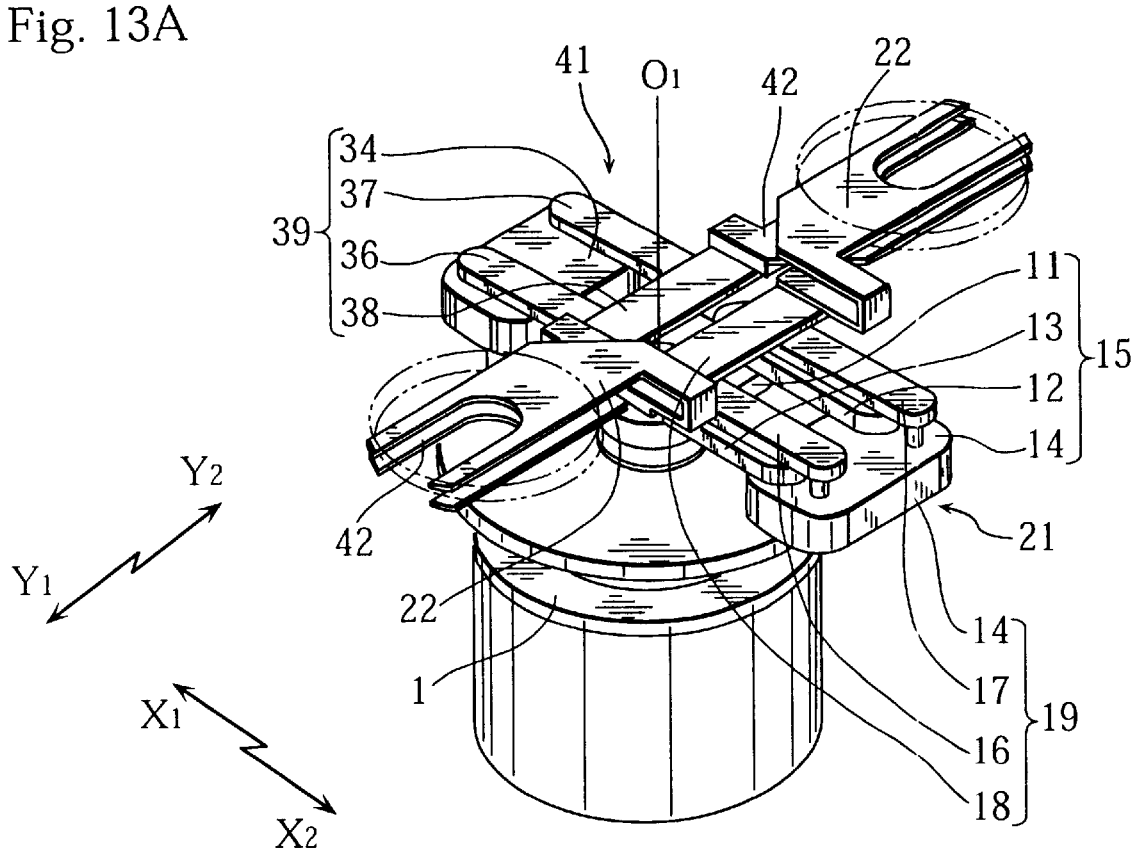
FIGS. 13A–13B are perspective view s showing another embodiment according to the present invention.
Figure 13B:
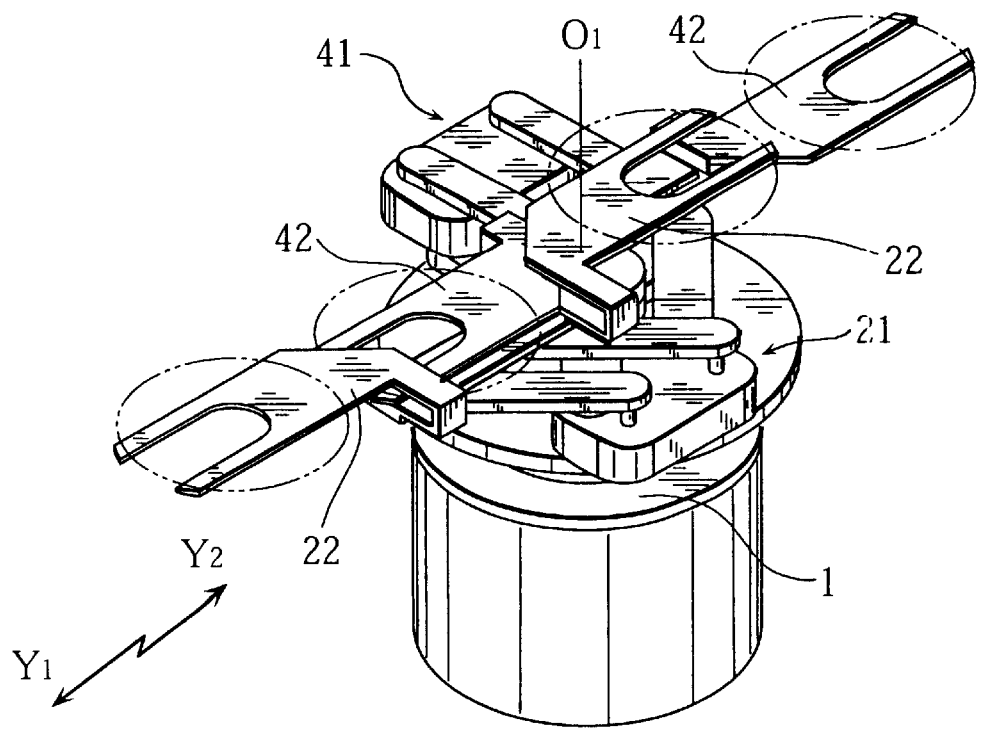
Figure 14:
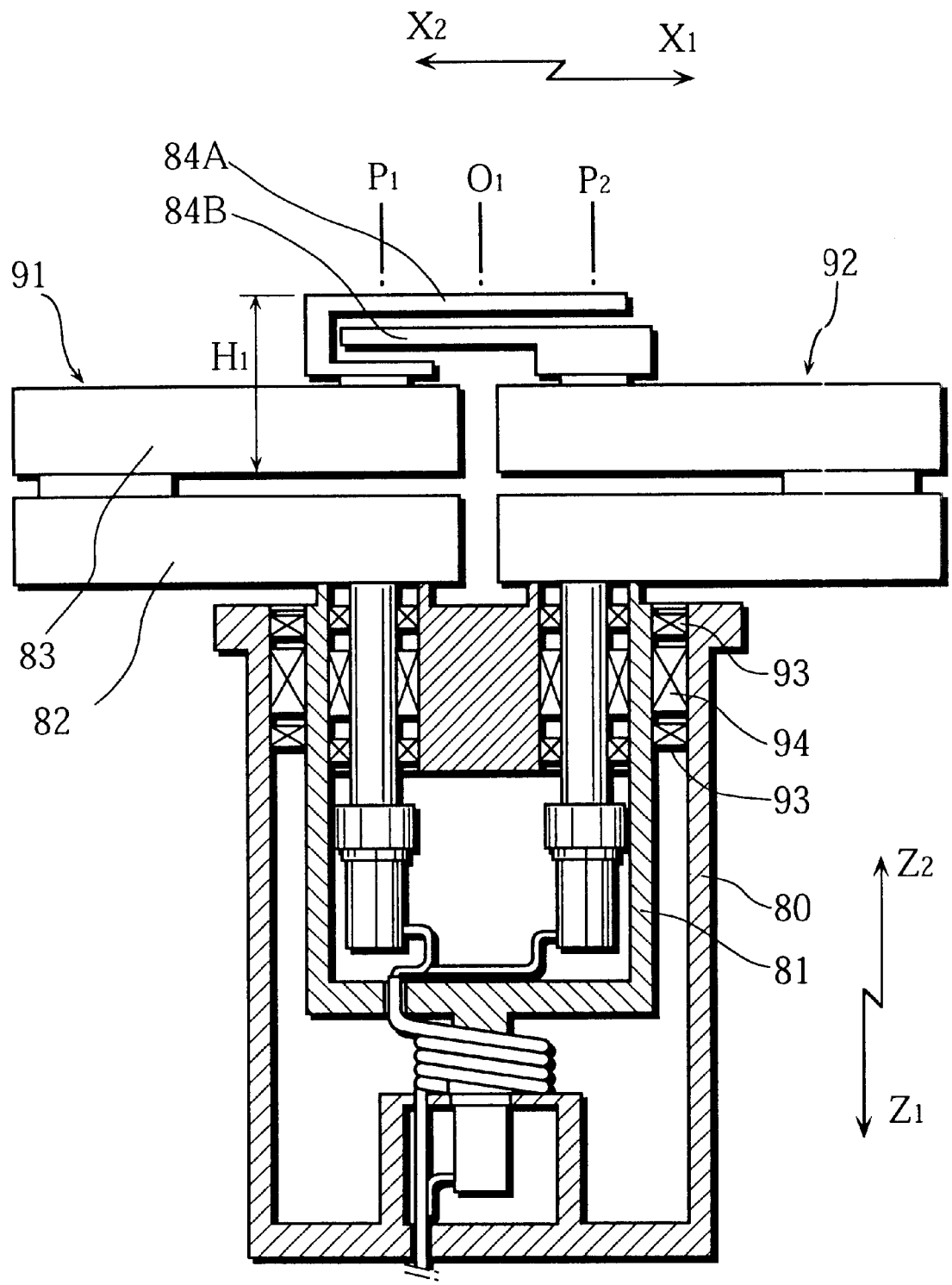
FIG. 14 is a front view showing, partly in section, a conventional transfer robot.
Figure 15:
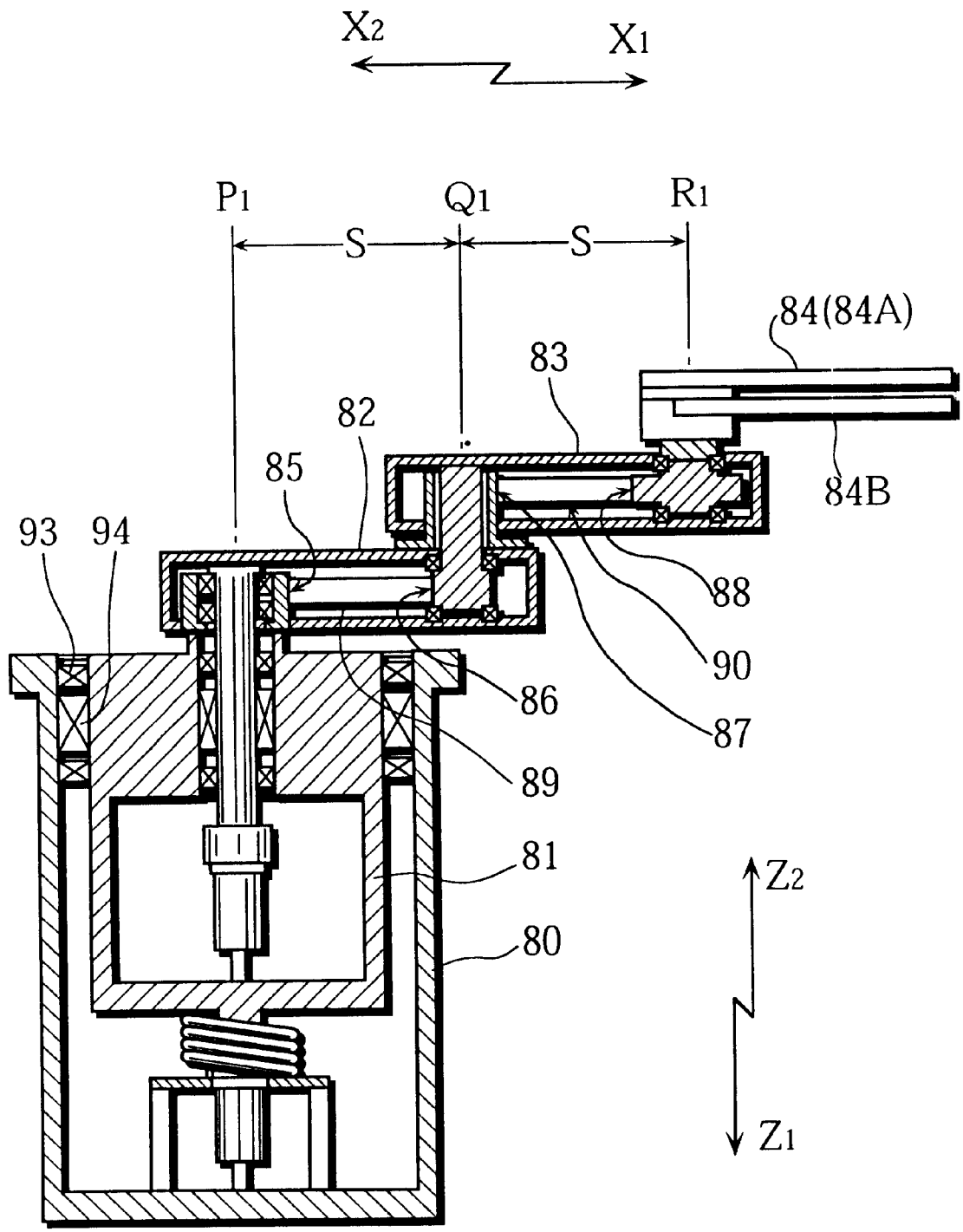
FIG. 15 is a sectional view showing the conventional robot of FIG. 14.
Figure 16:
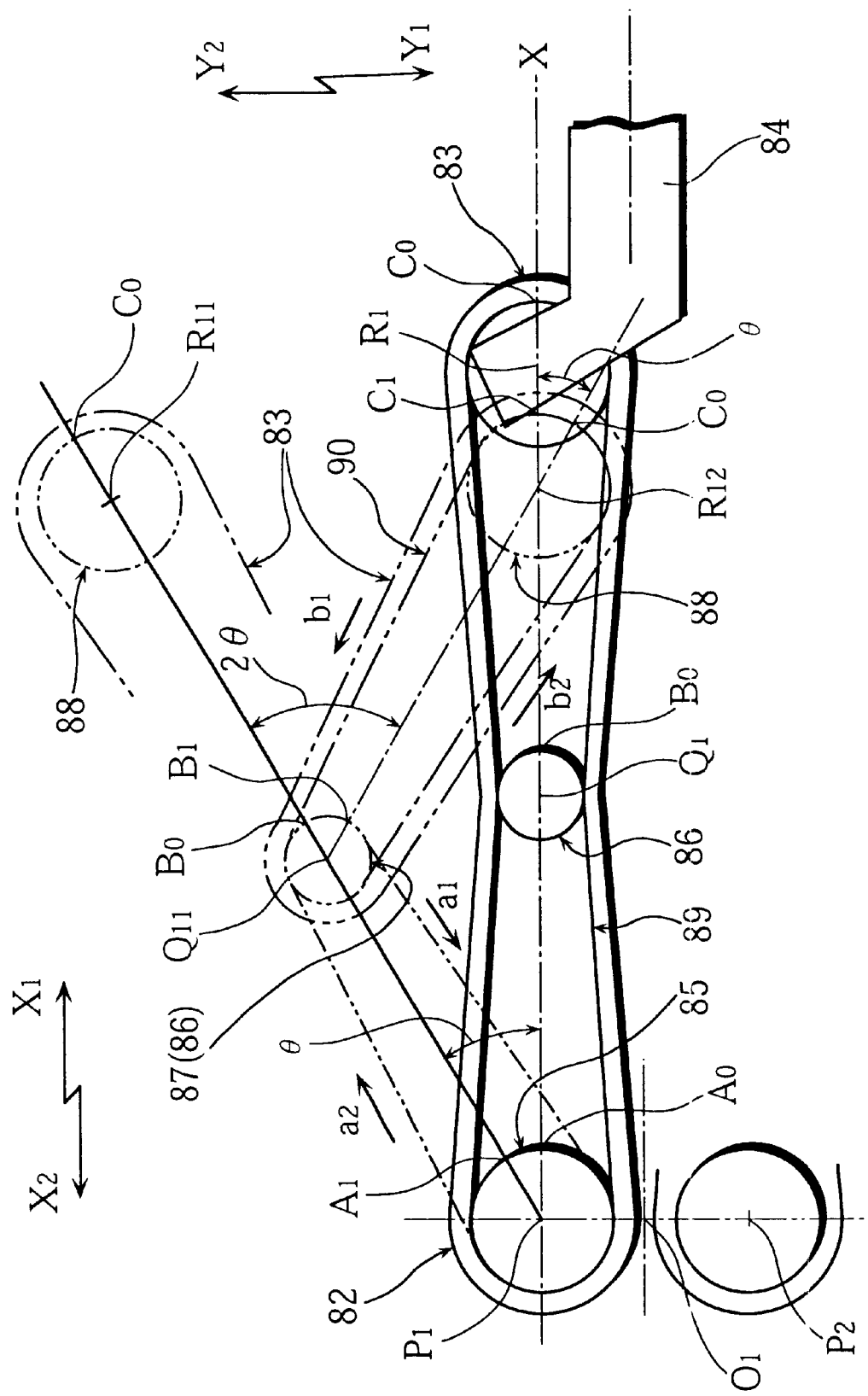
FIG. 16 is a plan view illustrating an arm mechanism of the conventional robot in operation.
Figure 17:
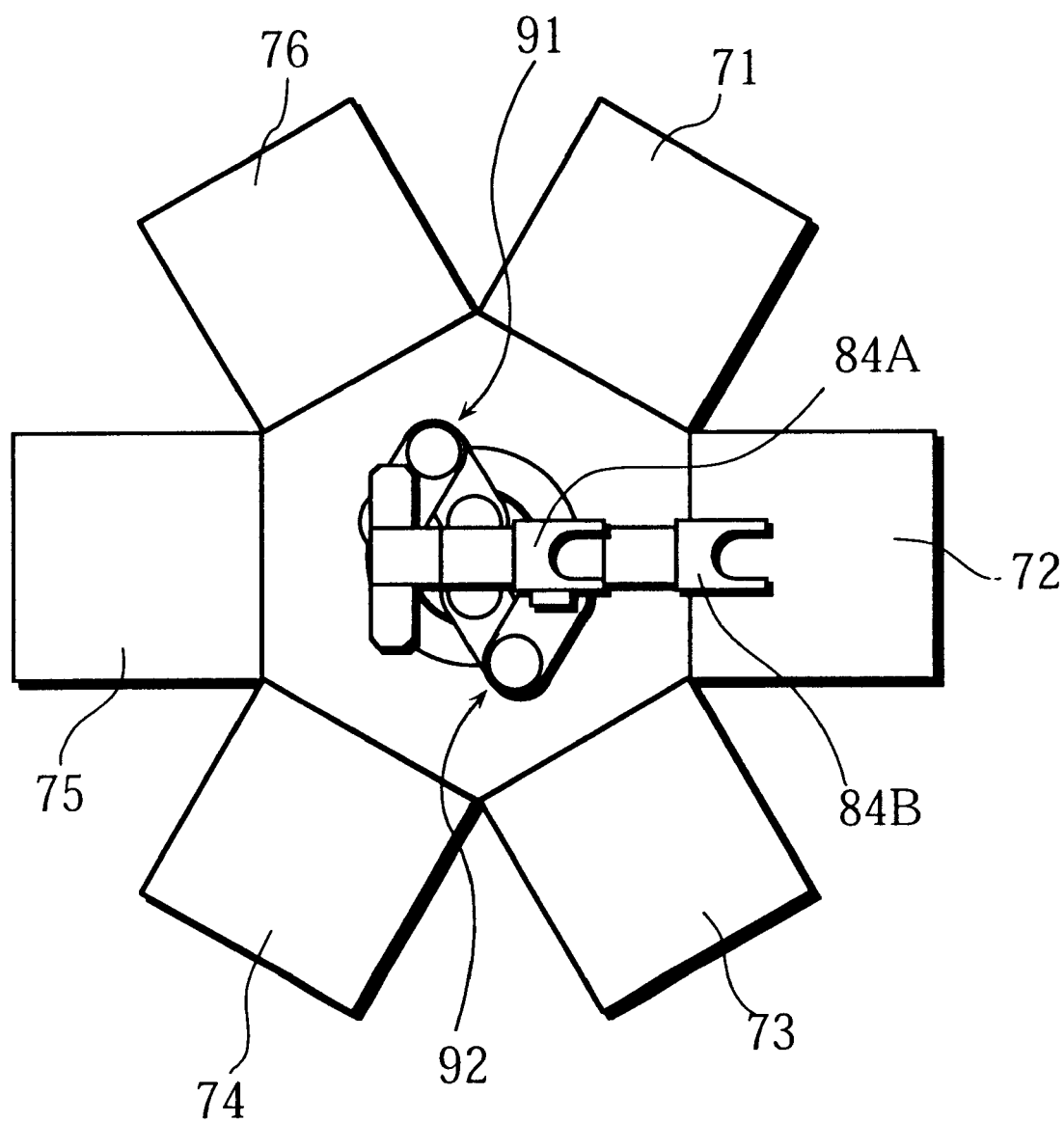
FIG. 17 is a plan view showing the conventional robot surrounded by processing chambers.

FIG. 13 shows another embodiment of the present invention. According to this embodiment, each of the hand-supporting links 18, 38 is provided with two handling members horizontally projecting opposite to each other.

The two handling members of each double-pantograph mechanism are moved in the $Y_1$–$Y_2$ direction for example. Thus, four workpieces can be shifted onto or away from the respective handling members, while the robot is held at a single angular position about the first axis $O_1$. Typically, the two arm mechanisms will not be moved in the same direction simultaneously. However, it is possible to move the arm mechanisms in the opposite directions for handling two workpieces at the same time.

In this way, the operation time of the robot is reduced, and therefore productivity is improved.

The preferred embodiments of the present invention being thus described, it is obvious that the same may be varied in many ways.

Such variations are not to be regarded as a departure from the spirit and scope of the present invention, and all such modifications as would be obvious to those skilled in the art are intended to be included within the scope of the following claims.

We claim:

1. A two-armed transfer robot comprising:
   a first double-pantograph mechanism and a second double-pantograph mechanism, each double-pantograph mechanism including a first pantograph assembly and a second pantograph assembly, the first pantograph assembly having an inner link, a pair of first intermediate links and an outer link associated with the inner link via the first intermediate links, the second pantograph assembly including the outer link in common with the first pantograph assembly, a pair of second intermediate links and a hand-supporting link associated with the outer link via the second intermediate links, the inner link being common to the first and the second double-pantograph mechanisms;

rotation-transmitting mechanisms provided between the first and the second intermediate links of the respective double-pantograph mechanism;

first and second handling members supported by the hand-supporting links of the first and the second double-pantograph mechanisms, respectively;

a stationary base member;

first to third shafts coaxially rotatable about a first axis extending vertically; and first to third driving devices for actuating the first to the third shafts, respectively, the driving devices being fixed to the base member;

wherein one of the first intermediate links of the first double-pantograph mechanism is fixed to the first shaft for rotation about the first axis, one of the first intermediate links of the second double-pantograph mechanism being fixed to the second shaft for rotation about the first axis, the inner link being fixed to the third shaft for rotation about the first axis, the other first intermediate links of the respective double-pantograph mechanisms being supported by the inner link for rotation about a common second axis, the first intermediate links and second intermediate links of each double-pantograph mechanism being equal in length, the second pantograph assembly of each double-pantograph mechanism being offset away from the first axis with respect to the first pantograph assembly of said each double-pantograph mechanism, the first and the second handling members being vertically spaced from each other, the handling members being arranged not only to linearly move in horizontal lines passing through the first axis but to rotate simultaneously around the first axis.

2. The transfer robot according to claim 1, wherein the second intermediate links of the respective double-pantograph mechanisms are arranged in a common plane.

3. The transfer robot according to claim 1, wherein the hand-supporting link of one double-pantograph mechanism is attached to an upper surface of each second intermediate link of said one double-pantograph mechanism, while the hand-supporting link of the other double-pantograph mechanism is attached to a lower surface of each second intermediate link of said other double-pantograph mechanism.

4. The transfer robot according to claim 1, wherein the first double-pantograph mechanism includes a third handling member attached to the hand-supporting link of the first double-pantograph mechanism, the third handling member projecting opposite to the first handling member, while the second double-pantograph mechanism includes a fourth handling member attached to the hand-supporting link of the second double-pantograph mechanism, the fourth handling member projecting opposite to the second handling member.

5. The transfer robot according to claim 1, wherein each of the first to the third shafts are rotatably supported via a magnetic fluid seal for hermetic sealing.

* * * * *